(12) United States Patent
Fang et al.

(10) Patent No.: US 7,197,684 B2
(45) Date of Patent: Mar. 27, 2007

(54) SINGLE-ENDED TRANSMISSION FOR DIRECT ACCESS TEST MODE WITHIN A DIFFERENTIAL INPUT AND OUTPUT CIRCUIT

(75) Inventors: Wayne Fang, Pleasanton, CA (US); Andy Chan, Saratoga, CA (US); Kuek-Hock Lee, Milpitas, CA (US)

(73) Assignee: Rambus Inc., Los Altos, CA (US)

( * ) Notice: Subject to any disclaimer, the term of this patent is extended or adjusted under 35 U.S.C. 154(b) by 294 days.

(21) Appl. No.: 10/839,635

(22) Filed: May 5, 2004

(65) Prior Publication Data

US 2005/0251720 A1 Nov. 10, 2005

(51) Int. Cl.
*G01R 31/28* (2006.01)
(52) U.S. Cl. .................... 714/742; 714/724
(58) Field of Classification Search ........ 714/742, 714/724; 327/108, 65; 326/30
See application file for complete search history.

(56) References Cited

U.S. PATENT DOCUMENTS 6,683,472 B2    1/2004 Best et al.
6,985,005 B1*   1/2006 Kim et al. .................. 326/26
7,010,637 B2*   3/2006 To et al. ..................... 710/305
2002/0170011 A1* 11/2002 Lai et al. .................... 714/727
2005/0193302 A1* 9/2005 Arguelles et al. .......... 714/733

* cited by examiner

*Primary Examiner*—James C Kerveros
(74) *Attorney, Agent, or Firm*—Vierra Magen Marcus & DeNiro LLP

(57) ABSTRACT

An integrated circuit, among other embodiments, includes an output circuit to provide a differential signal on first and second contacts during a first mode of operation, such as in a read or write mode of operation, and a single-ended signal on the first contact during a second mode of operation, such as a test mode of operation. A first variable resistor, responsive to a first control signal, is coupled to a first voltage source and the first contact. A second variable resistor, responsive to a second control signal, is coupled to a second voltage source and the second contact. A first transistor has a first electrode coupled to the first contact, a second electrode coupled to the current source and a gate to receive a first input signal. A second transistor has a first electrode coupled to the second contact, a second electrode coupled to the current source and a gate to receive a second input signal.

28 Claims, 4 Drawing Sheets

US 7,197,684 B2

SINGLE-ENDED TRANSMISSION FOR DIRECT ACCESS TEST MODE WITHIN A DIFFERENTIAL INPUT AND OUTPUT CIRCUIT

FIELD OF THE INVENTION

The present invention relates to output circuits.

BACKGROUND OF THE RELATED ART

Testing a device, or integrated circuit, is typically performed by test equipment. Testing may include measuring signals output from the integrated circuit. However, some integrated circuits may output a relatively small-swing differential signal that requires expensive test equipment for measuring the relatively small signal.

In order to avoid using the expensive testing equipment, an integrated circuit may be designed to include dedicated test output circuits coupled to test pads or contacts that output a larger single-ended signal. However, using dedicated test output circuits and pads increase circuit complexity, circuit area and the use of limited pad resources. Further, the increased parasitic capacitance contribution from the additional test output circuit would degrade input signal high frequency components during typical or normal operations.

Also during a wafer sort of semiconductor device manufacturing process, minimizing the number of test probes used to input and measure an output signal reduces test complexity and costs associated with additional probes.

Therefore, it is desirable to provide an integrated circuit having an output circuit for a typical operation as well as for a testing operation without requiring the use of expensive test equipment for measuring a small-swing differential signal.

BRIEF DESCRIPTION OF THE DRAWING

The present invention is illustrated by way of example, and not by way of limitation, in the figures of the accompanying drawing like reference numerals refer to similar elements.

DETAILED DESCRIPTION

An integrated circuit, such as an integrated circuit memory device, includes an output circuit capable to provide a differential signal on first and second contacts during a first mode of operation, such as in a read or write mode of operation, and a single-ended signal on the first contact during a second mode of operation, such as a test mode of operation. Variable resistors coupled to respective voltage sources and the first and second contacts are adjusted during the first and second modes of operation.

Figure 1:
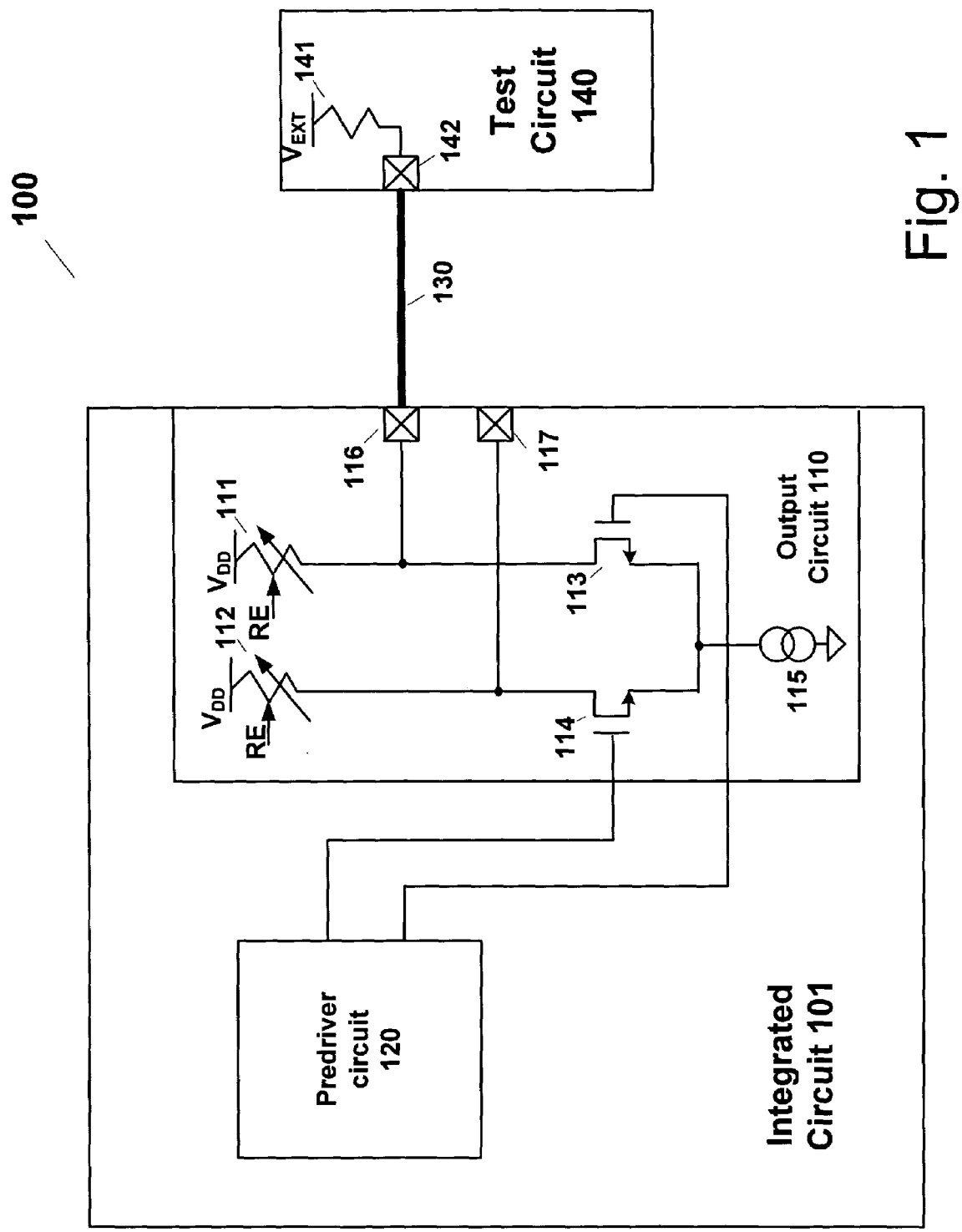
FIG. 1 illustrates an integrated circuit and a test device according to an embodiment of the present invention.

FIG. 1 illustrates an apparatus 100 including an integrated circuit ("IC") 101 having and output circuit 110 coupled to test circuit 140 according to an embodiment of the present invention. During a first mode of operation, output circuit 110 outputs a relatively small-swing differential signal on contacts 116 and contact 117; while during a second mode of operation, output circuit 110 outputs a larger single-ended signal on contact 116. Accordingly, expensive test equipment and dedicated output test circuits are not required during a test mode of operation.

A differential signal is a signal obtained by differencing a first varying signal and second varying signal. In an embodiment of the present invention, a first varying signal and a second varying signal include a first voltage signal and a second voltage signal, respectively. A differential signal typically requires two conducting elements or wires to transfer the first and second varying signals. A single-ended signal is a signal in which a first signal varies. A first conducting element or wire typically transfers the first signal; while a second conducting element or wire may be provided to supply a fixed value or reference voltage.

Figure 4:
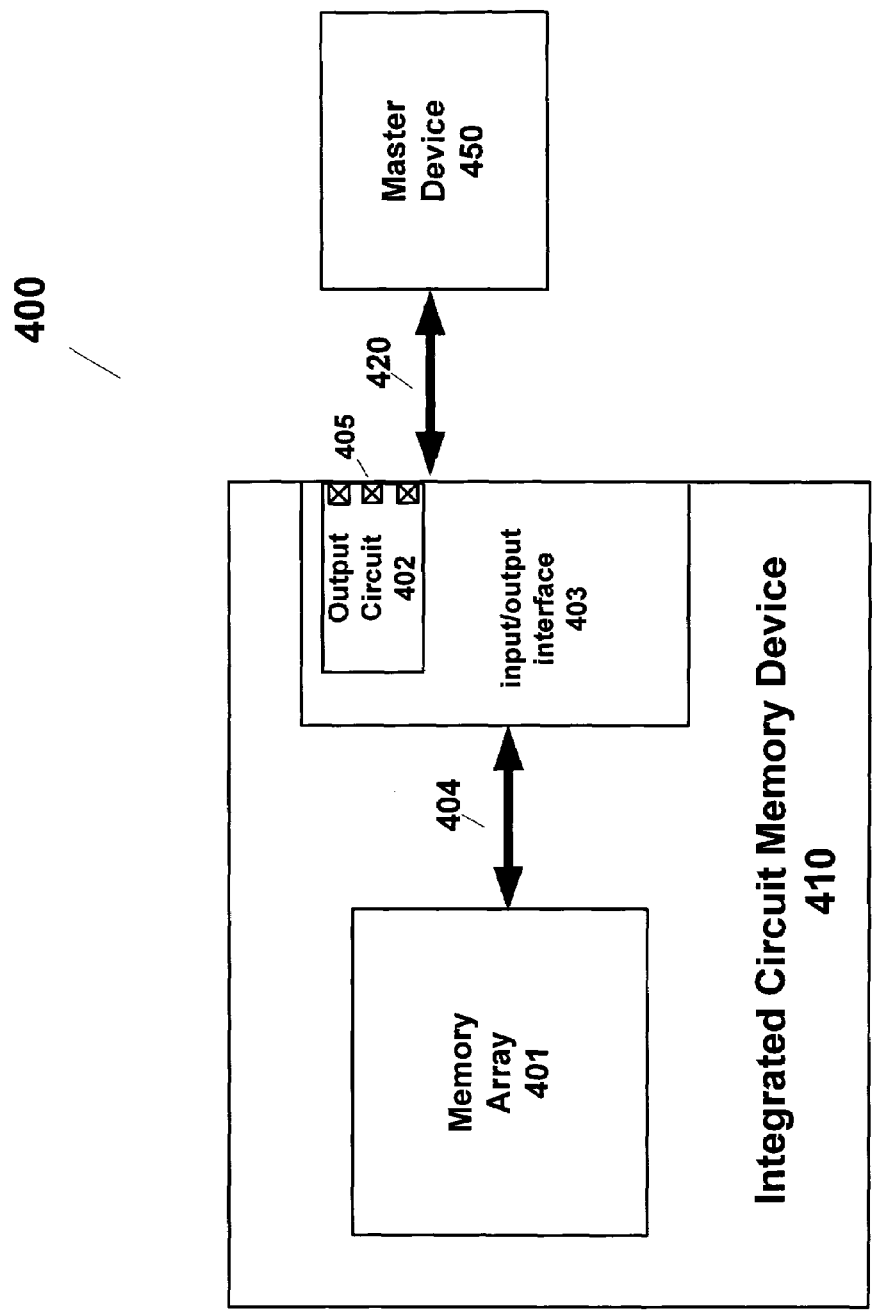
FIG. 4 illustrates an integrated circuit memory device according to an embodiment of the present invention.

A first mode of operation is a typical mode of operation of IC 101, such as a read or write mode of an IC memory device 410, as shown in FIG. 4, in an embodiment of the present invention. A master device 450, such as a memory controller, graphics controller or processor, is coupled to IC memory device 410 and provides signals to input/output interface 403 in order read or write to memory array 401. In the first mode of operation, a relatively small differential signal is output from IC memory device 410, in particular from output circuit 402 on contacts 405.

A second mode of operation is a test mode of operation of IC 101, such as a Direct Access Test Mode of an IC memory device 410. A second mode of operation includes a test write and/or test read mode of operation in embodiment of the present invention. In a second mode of operation, a test circuit 140 is coupled to IC 101 by interconnect 130. In an embodiment of the present invention, interconnect 130 is a cable, flexible tape, probe, wire, conducting element, equivalent or combination thereof. In an embodiment of the present invention, test circuit 140 is included in external test equipment used during manufacturing and/or testing of IC 101. Test circuit 140 includes a contact 142 coupled to resistor 141 that is coupled to a voltage source VEXT. Resistor 141 is a variable resistor in an embodiment of the present invention. A user or test equipment determines the resistance value of resistor 141 in order to obtain a desired relatively larger single-ended signal from IC 101 during a test mode of operation. In embodiments of the present invention, test equipment or a master device set a predetermined resistance value of resistor 141.

IC 101 is formed on a common substrate or die, such as a silicon wafer, or printed circuit board (PCB) in an embodiment of the present invention. IC 101 includes predriver circuit 120 coupled to driver or output circuit 110 in an embodiment of the present invention. Predriver circuit 120 provides a first and second input signal to output circuit 110, and in particular to the gates of transistors 114 and 113 (also known as steering devices 114 and 113) during a typical or test mode. Output circuit 110 includes contacts 116 and 117. In embodiments of the present invention, multiple output circuits and respective contacts are provided in IC 101. Contacts 116 and 117 are pads, pins, solder balls or conducting elements for transferring electrical signals in embodiments of the present invention. Output circuit 110 includes variable resistors 112 and 111 coupled to contacts 117 and 116, respectively. Variable resistors 112 and 111 are also coupled to voltage source VDD. Drains of n-type transistors 113 and 114 are coupled to variable resistors 111 and 112, respectively. Sources of n-type, negative-channel metal-oxide semiconductor ("NMOS"), transistors 113 and 114 are coupled to current source 115. In alternate embodiments of the present invention, p-type, positive-channel metal-oxide semiconductor ("PMOS"), transistors are used or a combination of n-type and p-type transistors are used.

During a typical mode of operation, IC 101 selects the respective resistance values of on die variable resistors 112 and 111 in order to output a small-swing differential signal on contacts 116 and 117. In embodiments of the present invention, IC 101 provides Read Enable ("RE") control signals to variable resistors 112 and 111 responsive to a command from master device 450 or during power-up.

In a test mode of operation, and in particular a read test mode operation, variable resistor 111 is disabled and resistor 141 in test circuit 140 is coupled to contact 116 by way of interconnect 130, so that output circuit 110 generates a large single-ended signal. In an embodiment of the present invention, variable resistor 111 is disabled by providing a RE control signal to variable resistor 111. Concurrently, a RE control signal is provided to variable resistor 112 selecting a predetermined resistance value that allows steering device 114 of output circuit 110 to turn on and off responsive to input signals from predriver circuit 120. If variable resistor 112 was disabled during a test read mode, the output circuit 110 would not be able to fully turn off the contact 116 steering device 113 of output circuit 110 when output circuit 110 is attempting to drive or output a logic "1" or high voltage value.

In a write test mode operation, both variable resistors 111, 112 and both steering devices 113 and 114 of output circuit 110 are disabled. This allows contact 117 to be pulled to an external reference voltage $V_{REF}$ by a separate voltage source and contact 116 can be pulled to a high voltage (logic 1) or low voltage (logic 0) by a variable voltage source $V_{EXT}$ of test circuit 140. Both variable resistors 111 and 112 are disabled because contact 117 is pulled to an external reference voltage $V_{REF}$.

Accordingly, output circuit 110 in IC 101 provides many useful advantages. First, dedicated output test circuits used during a test mode that may increase circuit complexity and circuit area including circuit contacts are not used. Second, a dedicated output test circuit that may degrade input signals due to parasitic capacitance is not used, thereby improving input signal quality. Third, expensive test equipment for testing small-swing differential signals are not required. Fourth, because a single-ended signal is output from IC 101 less testing probes are required during a test mode of IC 101.

Figure 2:
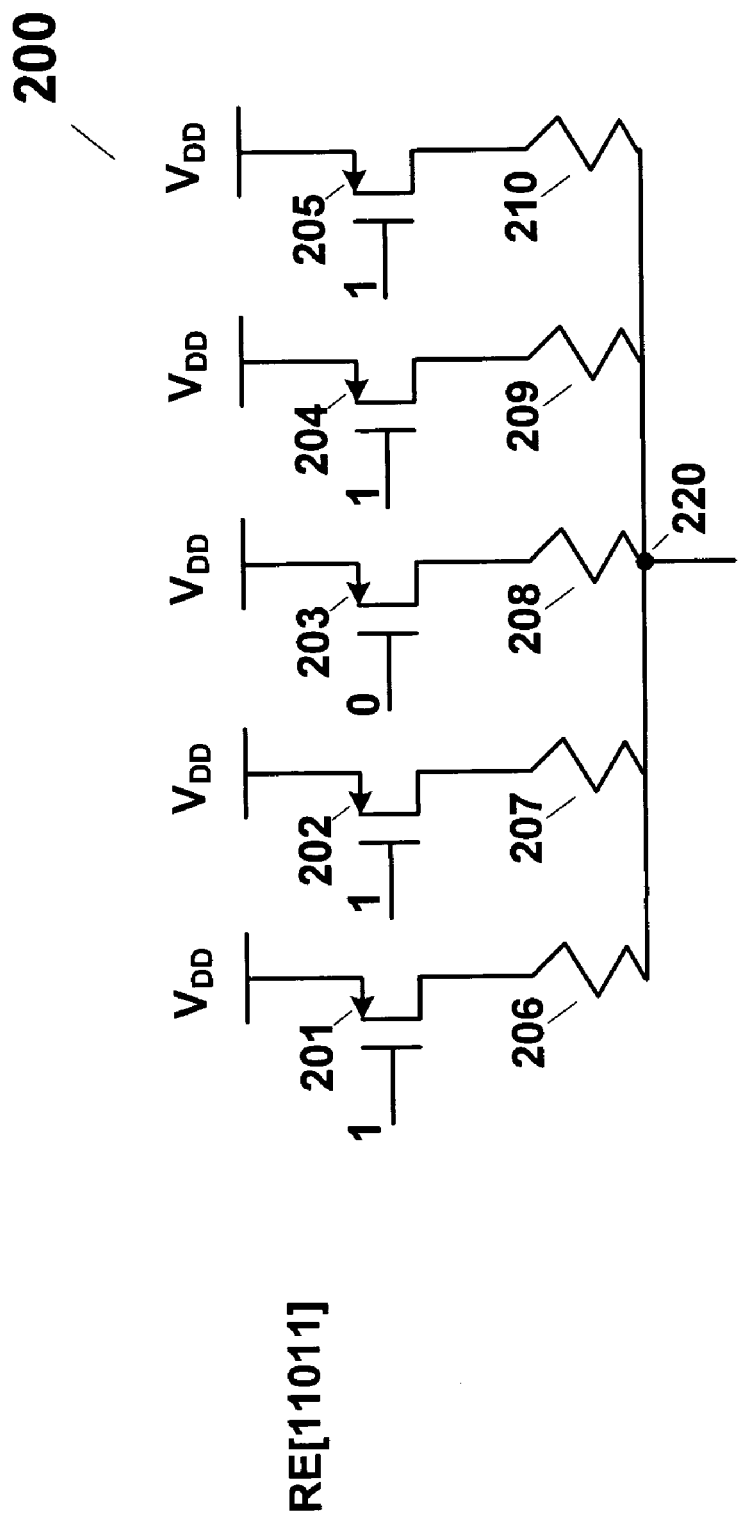
FIG. 2 illustrates a variable resistor according to an embodiment of the present invention.

FIG. 2 illustrates a variable resistor 200 used as variable resistors 112 and/or 111, as shown in FIG. 1, according to embodiments of the present invention. Variable resistor 200 includes a plurality of resistors 206–210 coupled to respective transistors 201–205, in particular, respective electrodes of transistors 201–205. A voltage source $V_{DD}$ is also coupled to the other respective electrodes of transistors 201–205. In an embodiment of the present invention, resistors 206–210 in series with transistors 201–205 have different impedance or resistance values. For example, resistors 206–210 in series with transistors 201–205 have resistance values 3200, 1000, 800, 400 and 200 ohms, respectively. In alternate embodiments of the present invention, more or less resistors are used. In an embodiment of the present invention, transistors 201–205 are p-type transistors. In alternate embodiments of the present invention, transistors 201–205 are n-type transistors. In still a further embodiment of the present invention, transistors 201–205 are a combination or n-type and p-type transistors.

Variable resistor 200 has a resistance valued based on a control signal RE selecting or turning on (or off) a particular transistor in the plurality of transistors 201–205. In an embodiment of the present invention, a control word RE[4:0] is provided to the gates of transistors 201–205. For example, for a control word RE[11011], a voltage value or logic "0" is applied to the gate of transistor 203 in order to provide a resistance value of resistor 208 between voltage source $V_{DD}$ and node 220. In particular, a first voltage value or logic "1" value is provided to transistors 201, 202, 204 and 205, while a second voltage value or logic "0" value is provided to transistor 203. If a particular transistor is selected thereby selecting a particular resistor and resistance value, variable resistor 200 is enabled. If a particular resistance is not selected (e.g. RE[11111]), variable resistor 200 is disabled. In an embodiment of the present invention, a global resistance control signal along with the control word RE[4:0] is transmitted to the variable resistor 200. If the global resistance control signal is disabled, the control word would be disabled (e.g. RE[11111]) or not provided to variable resistor 200. If the global resistance control signal is enabled, the control word would be provided to variable resistor 200 (e.g. RE[11011]).

Figure 3:
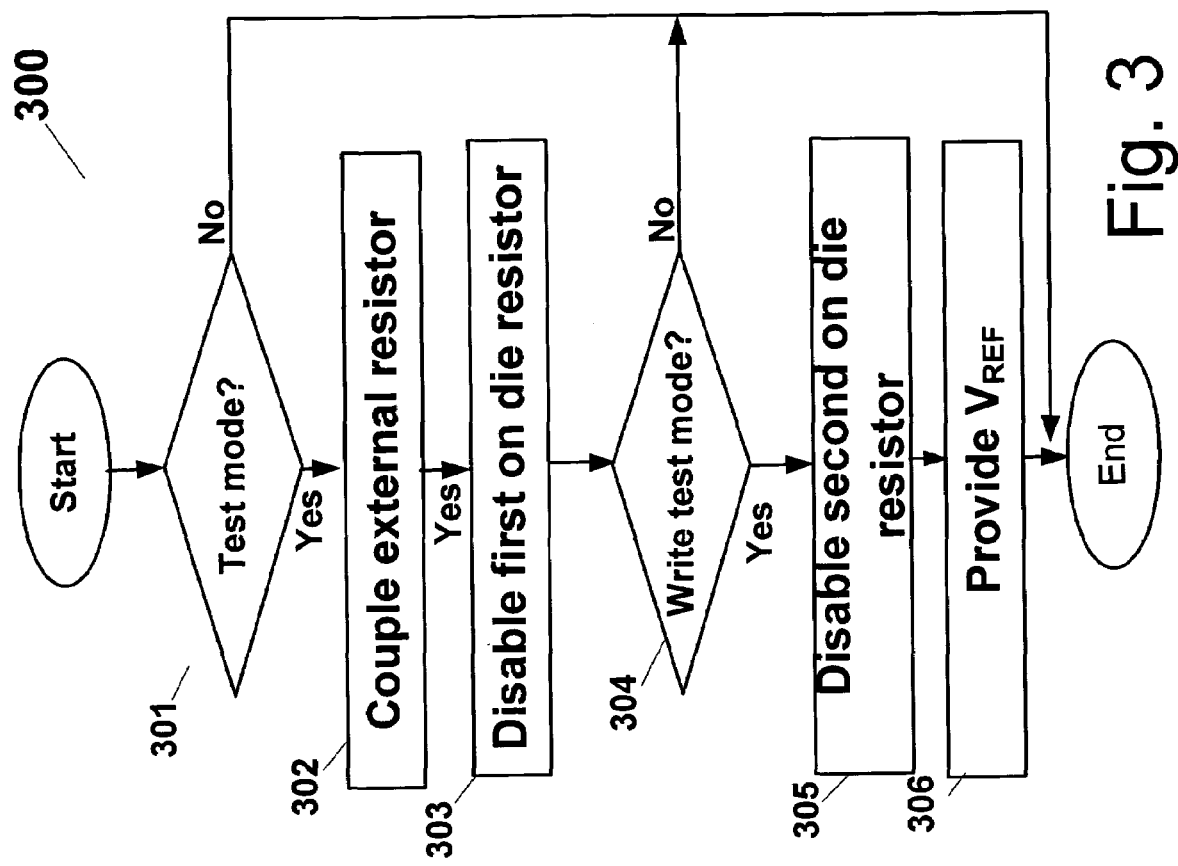
FIG. 3 illustrates a method according to an embodiment of the present invention.

FIG. 3 illustrates a method 300 according to an embodiment of the present invention. In alternate embodiments of the present invention, hardware, software, a user or a combination thereof carries out steps or logic blocks illustrated in FIG. 3. In alternate embodiments, the circuit components illustrated in FIGS. 1, 2 and 4, carry out the steps illustrated in FIG. 3. As one of ordinary skill in the art would appreciate, other steps that are not shown may be included in various embodiments of the present invention.

A determination is made whether an IC enters a test mode of operation as illustrated by logic block 301. If a test mode of operation is entered, an external resistor is coupled to an integrated circuit as illustrated by logic block 302; otherwise method 300 ends. In an embodiment of the present invention, a test circuit having a predetermined resistor in test equipment is coupled to a contact of an IC. An on die resistor coupled to the contact is disabled in order for the IC to output a single-ended signal as illustrated by logic block 303. A determination is made whether an IC enters a write test mode of operation as illustrated by logic block 304. If a write test mode of operation is entered as illustrated by logic block 305, a second on die resistor is disabled; otherwise method 300 ends. A voltage reference is then provided to a contact as illustrated by logic block 306. Method 300 ends and an IC then operates in a typical mode of operation, such that a small-swing differential signal is output from the IC.

FIG. 4 illustrates an IC memory device 410 having an output circuit 402 for providing a small-swing differential signal and large single-ended signal in a memory apparatus 400 according to an embodiment of the present invention. IC memory device 410 is a common class of integrated circuit devices that have a plurality of storage cells, collectively referred to as a memory array 401. A memory device stores data (which may be retrieved) associated with a particular address provided, for example, as part of a write or read command from master device 450.

Examples of types of memory devices include discretely packaged synchronous type dynamic random access memory ("DRAM") ICs, for example, double data rate SDRAM ("DDR") memory devices, Direct Rambus® memory devices ("DRDRAM"), or "XDR™" memory devices, although the memory devices might be any of a number of other types, including but not limited to static random access memory ("SRAM"), Ferroelectric RAM ("FRAM"), Magnetoresistive or Magnetic RAM ("MRAM"), Flash, or read only memory ("ROM") singly or in combination.

IC memory device 410 includes input/output interface 403 that includes request decode and array access logic that, among other functions, decodes request and address information, and controls memory transfers between memory array 401 and routing path 404. Input/output interface 403 includes output circuit 402 for transmitting and receiving data on the contacts in an embodiment of the present invention. In an embodiment of the present invention, output circuit 110 shown in FIG. 1, is used as output circuit 402. Data is transmitted and received synchronously with respect to rising and falling edges of a clock signal.

Interconnect 420 couples IC memory device 410 to master device 450 in an embodiment of the present invention. Master device 450 provides electrical signals, such as data, read or write commands, on interconnect 420. Similarly, IC memory device outputs data onto interconnect 420, which is a bus or point-to-point link in embodiments of the present invention. Interconnect 420 includes a plurality of traces, wires, conducting elements or backplane link for conducing electrical signals in embodiments of the present invention. Interconnect 420 is a unidirectional or bidirectional interconnect in embodiments of the present invention.

Apparatus 400 is positioned on a printed circuit board in an embodiment of the present invention.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An integrated circuit comprising:
a first contact;
a second contact; and
an output circuit to provide a differential signal on the first and second contacts during a first mode of operation and a single-ended signal on the first contact during a second mode of operation,
wherein the output circuit includes,
a first variable resistor, coupled to a first voltage source and the first contact, responsive to a first control signal;
a second variable resistor, coupled to a second voltage source and the second contact, responsive to a second control signal;
a current source;
a first transistor having a first electrode coupled to the first contact, a second electrode coupled to the current source and a gate to receive a first input signal; and,
a second transistor having a first electrode coupled to the second contact, a second electrode coupled to the current source and a gate to receive a second input signal, wherein the differential signal is provided on the first and second contacts responsive to the first and second input signals.

2. The integrated circuit of claim 1, wherein the second mode of operation is a test mode of operation.

3. The integrated circuit of claim 2, wherein the test mode of operation is a Direct Access Test Mode for a memory device.

4. The integrated circuit of claim 2, wherein the first variable resistor is disabled responsive to a control signal provided during the second mode of operation.

5. The integrated circuit of claim 1, wherein the first and second transistors are n-type transistors.

6. The integrated circuit of claim 1, wherein a predriver circuit is coupled to the output circuit.

7. An integrated circuit comprising:
a first contact;
a second contact; and
an output circuit, coupled to the first and second contacts, to provide a differential signal on the first and second contacts during a first mode of operation and a single-ended signal on a first contact during a second mode of operation; and,
a predriver circuit, coupled to the output circuit, to provide a first and second input signal to the output circuit,
wherein the output circuit includes,
a first variable resistor, coupled to a first voltage source and the first contact, responsive to a first control signal;
a second variable resistor, coupled to a second voltage source and the second contact, responsive to second control signal;
a first current source;
a first transistor having a first electrode coupled to the first contact, a second electrode coupled to the first current source and a gate to receive the first input signal; and,
a second transistor having a first electrode coupled to the second contact, a second electrode coupled to the first current source and a gate to receive the second input signal, wherein the differential signal is provided on the first and second contacts responsive to the first and second input signals.

8. The integrated circuit of claim 7, wherein the first and second voltage sources are the same.

9. The integrated circuit of claim 8, wherein the first and second transistors are n-type transistors.

10. The integrated circuit of claim 9, wherein the first and second variable resistors are disabled responsive to the first and second control signals, respectively.

11. An apparatus comprising:
an integrated circuit including,
a first contact;
a second contact;
a output circuit to provide a differential signal on the first and second contacts during a first mode of operation and a single-ended signal on the first contact during a second mode of operation; and,
a test circuit, coupled to the integrated circuit, having a resistor with a predetermined value coupled to the first contact, during the second mode of operation.

12. The apparatus of claim 11, wherein the second mode of operation is a test mode of operation.

13. The apparatus of claim 12, wherein the test mode of operation is a Direct Access Test Mode for a memory device.

14. The apparatus of claim 11, wherein the output circuit includes a resistor, coupled to the second contact, disabled responsive to a control.

15. The apparatus of claim 11, wherein the test circuit is included in an external test equipment.

16. The apparatus of claim 11, wherein a predriver circuit is coupled to the output circuit.

17. The apparatus of claim 11, wherein the output circuit includes, a first variable resistor, coupled to a first voltage source and the first contact, responsive to a first control signal;
a second variable resistor, coupled to a second voltage source and the second contact, responsive to second control signal;
a current source;
a first transistor having a first electrode coupled to the first contact, a second electrode coupled to the current source and a gate to receive a first input signal; and,
a second transistor having a first electrode coupled to the second contact, a second electrode coupled to the current source and a gate to receive a second input signal, wherein a the differential signal is provided on the first and second contacts responsive to the first and second input signals.

18. The apparatus of claim 17, wherein the first and second transistors are n-type transistors.

19. A method for testing an integrated circuit that outputs a differential signal, comprising:
coupling a first contact of the integrated circuit to a test circuit;
disabling a first resistor coupled to the first contact of the integrated circuit;
enabling a resistor, in the test circuit, coupled to the first contact; and
outputting a single-ended signal from the integrated circuit to the test circuit.

20. The method of claim 19, wherein the method is performed during a read test mode.

21. The method of claim 19, further comprising:
disabling a second resistor coupled to a second contact during a test write mode, and providing a reference voltage to the second contact.

22. The method of claim 19, wherein the integrated circuit is an integrated circuit memory device outputting a single-ended signal during a test mode of operation.

23. The method of claim 19, wherein the test circuit is included in an external test equipment.

24. A An integrated circuit memory device, comprising:
a memory array; and
an interface including:
a first contact,
a second contact, and
an output circuit, coupled to the first and second contacts, to provide a differential signal on the first and second contacts during a first mode of operation and a single-ended signal on the first contact during a second mode of operation,
wherein the output circuit includes,
a first variable resistor, coupled to a first voltage source and the first contact, responsive to a first control signal,
a second variable resistor, coupled to a second voltage source and the second contact, responsive to second control signal,
a first current source,
a first transistor having a first electrode coupled to the first contact, a second electrode coupled to the first current source and a gate to receive the first input signal, and
a second transistor having a first electrode coupled to the second contact, a second electrode coupled to the first current source and a gate to receive the second input signal, wherein the differential signal is provided on the first and second contacts responsive to the first and second input signals.

25. The integrated circuit memory device of claim 24, wherein the first and second voltage sources are the same.

26. The integrated circuit memory device of claim 24, wherein the first and second transistors are n-type transistors.

27. The integrated circuit memory device of claim 24, wherein the first and second variable resistors are disabled responsive to the first and second control signals, respectively.

28. An integrated circuit, comprising:
a first contact;
means for coupling the first contact of the integrated circuit to a test circuit;
means for disabling a first resistor coupled to the first contact of the integrated circuit:
means for enabling a resistor, in the test circuit, coupled to the first contact; and
means for outputting a single-ended signal from the integrated circuit to the test circuit.

* * * * *